United States Patent
Yu et al.

(10) Patent No.: US 11,455,189 B2
(45) Date of Patent: Sep. 27, 2022

(54) TASK SCHEDULING SIMULATION SYSTEM

(71) Applicant: SHENZHEN INSTITUTES OF ADVANCED TECHNOLOGY CHINESE ACADEMY OF SCIENCES, Guangdong (CN)

(72) Inventors: Zhibin Yu, Guangdong (CN); Lele Li, Guangdong (CN)

(73) Assignee: SHENZHEN INSTITUTES OF ADVANCED TECHNOLOGY CHINESE ACADEMY OF SCIENCES, Guangdong (CN)

( * ) Notice: Subject to any disclaimer, the term of this patent is extended or adjusted under 35 U.S.C. 154(b) by 54 days.

(21) Appl. No.: 17/055,606

(22) PCT Filed: Dec. 9, 2019

(86) PCT No.: PCT/CN2019/124086
§ 371 (c)(1),
(2) Date: Nov. 16, 2020

(87) PCT Pub. No.: WO2020/119649
PCT Pub. Date: Jun. 18, 2020

(65) Prior Publication Data
US 2021/0224110 A1    Jul. 22, 2021

(30) Foreign Application Priority Data
Dec. 14, 2018    (CN) .......................... 201811535124.4

(51) Int. Cl.
*G06F 9/48*    (2006.01)
*G06F 30/20*    (2020.01)

(52) U.S. Cl.
CPC ............ *G06F 9/4881* (2013.01); *G06F 30/20* (2020.01)

(58) Field of Classification Search
CPC ......... G06F 9/4843; G06F 9/4881; G06F 9/52
(Continued)

(56) References Cited

U.S. PATENT DOCUMENTS

| 9,699,049 B2 * | 7/2017 | Gupta | ................... | H04L 41/147 |
| 10,346,188 B1 * | 7/2019 | Christensen | .......... | G06F 9/5033 |

(Continued)

FOREIGN PATENT DOCUMENTS

| CN | 101246439 | 8/2008 |
| CN | 104298550 | 1/2015 |
| CN | 104915407 | 9/2015 |

OTHER PUBLICATIONS

"International Search Report (Form PCT/ISA/210) of PCT/CN2019/124086," dated Mar. 6, 2020, pp. 1-4.

*Primary Examiner* — Andy Ho
(74) *Attorney, Agent, or Firm* — JCIP Global Inc.

(57) ABSTRACT

The application provides a task scheduling simulation system, comprising a data preprocessing subsystem and a task scheduling subsystem. The data preprocessing subsystem filters the input cloud computing log information for abnormal data and extracts the running time of each task. The task scheduling subsystem enqueues or dequeues tasks from the batch task and real-time task running queues of each node, and keeps the tasks currently running in the cluster consistent with the actual production environment, and updates the number of CPU cores and the used and available memory capacity of each node according to resource requirement of each task. The mixed scheduling simulation of batch tasks and online tasks can be realized, and the resource simulation of the heterogeneous CPU core number and memory capacity of the cluster nodes can be simulated.

6 Claims, 2 Drawing Sheets

(58) Field of Classification Search
USPC .................................................. 718/100, 102
See application file for complete search history.

(56) References Cited

U.S. PATENT DOCUMENTS

| | | | |
|---|---|---|---|
| 10,510,007 B2* | 12/2019 | Singhal | G06N 5/022 |
| 10,572,306 B2* | 2/2020 | Kambatla | G06F 9/5038 |
| 10,831,633 B2* | 11/2020 | Hasija | H04L 67/30 |
| 2011/0161974 A1 | 6/2011 | Kurabayashi et al. | |
| 2014/0245298 A1* | 8/2014 | Zhou | G06F 9/45558 |
| | | | 718/1 |

* cited by examiner

TASK SCHEDULING SIMULATION SYSTEM

CROSS-REFERENCE TO RELATED APPLICATION

This application is a 371 of international application of PCT application serial no. PCT/CN2019/124086, filed on Dec. 9, 2019, which claims the priority benefit of China application no. 201811535124.4, filed on Dec. 14, 2018. The entirety of each of the above mentioned patent applications is hereby incorporated by reference herein and made a part of this specification.

TECHNICAL FIELD

This application belongs to the field of cloud computing technology, and particularly relates to a task scheduling simulation system.

DESCRIPTION OF RELATED ART

The task scheduling simulation system on the cloud computing platform can use several machine nodes far less than the number of machines in the production environment according to the log records of task operation in the production environment, to truly reflect the number of tasks to be processed by the resource management scheduling system at a certain time, as well as the changes such as the downtime and addition of cluster nodes, in order to provide researchers with an experimental environment that is highly consistent with the real production environment for the research of the scheduling algorithm, thereby providing support for the effectiveness of the scheduling algorithm. On the other hand, compared with the case that the production environment lacks the records of the worst task scheduling considerations, the task scheduling simulation system can simulate the experimental scenario where the peak value of the number of submitted tasks or the resource utilization of the entire cluster reaches a critical value through some special settings. Thus, it provides an operating environment for testing the operating efficiency of the newly designed scheduling algorithm in the worst case.

The Yarn simulation system (Scheduler Load Simulator, SLS) in the big data processing system Hadoop simulates and runs batch tasks based on Map-Reduce. The input of SLS running is the running log of batch tasks, including the running time of each task and the CPU and memory resources it requires. However, in the data center 24-hour log records published by some cloud computing platforms, it is the mixed scheduling and running of batch tasks and online tasks on some cloud computing data centers. The SLS can only be aimed at the simulation system of Map-Reduce single batch tasks in Hadoop.

SUMMARY

1. Technical Problems to be Solved

The Yarn simulation system (Scheduler Load Simulator, SLS) in the big data processing system Hadoop simulates and runs batch tasks based on Map-Reduce. The input of SLS running is the running log of batch tasks, including the running time of each task and the CPU and memory resources it requires. However, in the data center 24-hour log records published by some cloud computing platforms, it is the mixed scheduling and running of batch tasks and online tasks on some cloud computing data centers. The SLS can only be aimed at the issues of the simulation system of Map-Reduce single batch tasks in Hadoop. This application provides a task scheduling simulation system.

2. Technical Solution

In order to achieve the above objective, this application provides a task scheduling simulation system, which includes a data preprocessing subsystem and a task scheduling subsystem.

The data preprocessing subsystem is used to filter the input cloud computing log information for abnormal data and extract the running time of each task.

The task scheduling subsystem is used to enqueue or dequeue tasks from the batch task and real-time task running queues of each node, and keep the number and status of tasks currently running in the cluster consistent with the actual production environment, and update the number of CPU cores and the used and available memory capacity of each node according to resource requirement of each task, to obtain the latest topology of the overall cluster resource utilization.

Optionally, the data preprocessing subsystem includes a data exception and missing processing module, a task information counting module, a resource demand counting module, and a running time counting module.

The data exception and missing processing module is used to read the native cloud computing cluster operation log to exclude abnormal data.

The task information counting module is used to count the task information and the number of task instances of each submitted job.

The resource demand counting module is used to count the total required number of CPU cores and the total required capacity of memory for each job.

The running time counting module is used to calculate the running time of each task instance, and to counting the estimated running time of each job.

Optionally, the task information counting module, the resource demand counting module and the running time counting module may simultaneously start 3 threads for parallel processing.

Optionally, the task scheduling subsystem includes a task operation information processing unit, a control unit, and a machine node event processing unit.

The task operation information processing unit includes a task operation information loading module, a task event driving module and a task scheduling algorithm module.

The control unit includes a simulator operation control module and a machine node resource information counting and collecting module.

The machine node event processing unit includes a machine node event information module and a machine node event driving module.

Optionally, the task event driving module includes a batch task event driving submodule and an online task event driving submodule.

Optionally, the machine node event information module includes a node adding submodule and a node deleting submodule.

Optionally, the machine node event driving module includes a hash table.

3. Beneficial Effects

Compared with the prior art, the beneficial effects of the task scheduling simulation system provided by this application are as follows.

The task scheduling simulation system provided by this application realizes the mixed scheduling simulation of batch tasks and online tasks by setting the data preprocessing subsystem and task scheduling subsystem, and can also simulates the resource of the CPU core number and memory capacity of cluster nodes heterogeneity.

DESCRIPTION OF THE EMBODIMENTS

Figure 1:
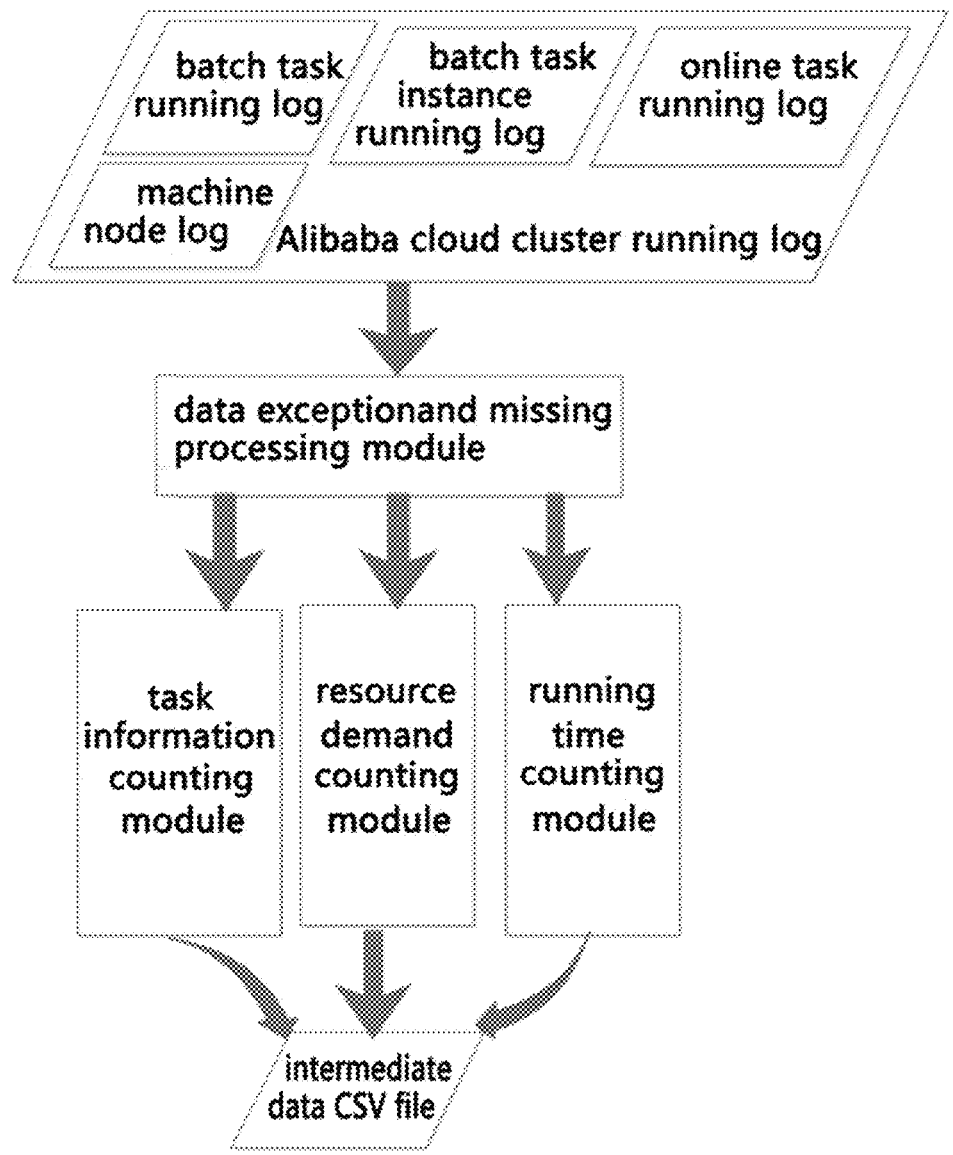
FIG. 1 is a work flowchart of a data preprocessing subsystem of the task scheduling simulation system according to the present application.

Hereinafter, specific embodiments of the application will be described in detail with reference to the accompanying drawings. According to these detailed descriptions, those skilled in the art can clearly understand and implement the application. Without departing from the principle of the present application, the features of different embodiments can be combined to obtain new implementations, or some features in some embodiments can be replaced to obtain other preferred implementations.

A cluster is a group of independent computers interconnected by a high-speed network. They form a group and are managed as a single system. When a client interacts with the cluster, the cluster operates like an independent server. The cluster configuration is used to improve availability and scalability. Compared with traditional high-performance computer technology, cluster technology can use various grades of servers as nodes, thus the system cost is low, and it can achieve high-speed computation, complete large-scale calculations, and has high responsiveness, which can meet today's increasing demand for information services. The cluster technology is a general technology, its purpose is to solve the inadequacy of single-machine computing power, the inadequacy of IO capabilities, improve service reliability, obtain scale scalability, and reduce the operation and maintenance costs (operation, upgrade, maintenance costs) of the overall solution. In the situations in which other technologies cannot achieve the above goals, or the above goals can be achieved, but the cost is too high, cluster technology can be considered.

In the data center of the modern cloud computing platform, there are tens of thousands of cluster machines. For example, Google announced in 2011 that the scale of cluster nodes could reach 12,500. In 2016, the number of machines in Microsoft's data center exceeded 50,000. At the same time, in these large data centers, tens of thousands of jobs and tasks are scheduled and run every day. An effective job scheduling algorithm can reasonably allocate jobs to the machine nodes that meet its running resource requirements, and significantly improve cluster resource utilization and task throughput per unit time. However, compared with the large-scale cluster nodes in the enterprise production environment, the machine nodes of the relevant research team are smaller, generally less than a few hundred, which is not enough to truly and accurately restore the actual task scheduling status of the enterprise production environment. Therefore, in order to verify the effectiveness of the new scheduling algorithm in the actual production environment, it is particularly important to find a system that can fully simulate the real task scheduling in the production environment and can run on a few machines.

The input of SLS does not include the hardware resource information of the cluster nodes and the dynamic addition and deletion logs of the cluster nodes during the operation period. The outputs of SLS operation are the memory usage at the JVM level and the CPU core usage on the entire cluster, which lacks the records of the resource utilization statistics information on a single machine node. SLS just treats the node resources in the cluster as homogeneous machines with the same number of CPU cores and memory size when simulating them.

API is a calling interface left by the operating system to the application program. The application program makes the operating system execute the commands of the application program by calling the operating system's API.

Hash table is a data structure that is directly accessed according to the key value. In other words, it accesses the record by mapping the key value to a location in the table to speed up the search. This mapping function is called a hash function, and the array which stores records is called a hash table.

Comma-Separated Values (CSV, sometimes referred to as character-separated values, because the separator may not be a comma) have its files to store tabular data (numbers and text) in plain text. Plain text means that the file is a sequence of characters without data that must be interpreted like binary numbers. A CSV file consists of any number of records, separated by a certain type of newline character. Each record is composed of fields, separated by other characters or strings, the most common one is comma or tab.

This application provides a task scheduling simulation system, the system includes a data preprocessing subsystem and a task scheduling subsystem.

The data preprocessing subsystem is used to filter the input cloud computing log information for abnormal data and extract the running time of each task;

The task scheduling subsystem is used to enqueue or dequeue tasks from the batch task and real-time task running queues of each node, and keep the number and status of tasks currently running in the cluster consistent with the actual production environment, and update the number of CPU cores and the used and available memory capacity of each node according to resource requirement of each task, to obtain the latest topology of the overall cluster resource utilization.

Optionally, the data preprocessing subsystem includes a data exception and missing processing module, a task information counting module, a resource demand counting module, and a running time counting module.

The data exception and missing processing module is used to read the native cloud computing cluster operation log to exclude abnormal data.

The task information counting module is used to count the task information and the number of task instances of each submitted job.

The resource demand counting module is used to count the total required number of CPU cores and the total required capacity of memory for each job.

The running time counting module is used to calculate the running time of each task instance, and to counting the estimated running time of each job.

The input of the data preprocessing subsystem is the native cloud computing task running log, and the output is the native cloud computing task log information and the above statistical information. The above statistical information can be obtained by the user through the API provided by the system. The return format of the information is json. The hardware requirement resources of the task can be displayed on the web page according to the information and the third-party chart visualization tool.

Optionally, the task information counting module and the resource demand counting module, and the running time counting module can simultaneously start 3 threads for parallel processing.

The task scheduling subsystem includes a task operation information processing unit, a control unit, and a machine node event processing unit.

The task operation information processing unit includes a task operation information loading module, a task event driving module and a task scheduling algorithm module.

The control unit includes a simulator operation control module, and a machine node resource information counting and collecting module.

The machine node event processing unit includes a machine node event information module and a machine node event driving module.

The task event driving module includes a batch task event driving submodule and an online task event driving submodule.

The task operation information loading module is used to:

S101: classifying the batch tasks and online tasks.

S102: adding the time stamp in the task record as the key value and the task record as the value to the Leveldb database with higher sequential read and write performance supported by the simulator.

S103: loading the data information of the machine node to the map disordered set in the memory of the simulator, wherein the key is the timestamp of the machine node event, and the value is the data record of the machine node.

The machine node event driving module is used to perform:

S201: in response to an increase or failure event of related machine nodes, the simulator updates the globally available machine nodes of the cluster using an event driving model, according to the wal-clock time of the current simulator.

S202: outputting the update information of the machine node to the relevant directory using the Google log recording module.

The batch task event driving module is used to perform:

S301: executing event processing in response to the running event state (prepare, wait, terminate, fail, cancel, interrupt) of the batch task instance using the event driving model, according to the wal-clock time of the current simulator. If the batch task instance is in the wait state, the S5 task algorithm scheduling module is triggered to execute the relevant algorithm for task scheduling. If the task instance is in the fail state, terminate state or cancel state, the resource information on the running node is updated.

The online task event driving module is used to perform:

S401: using an event-driven model, based on the wal-clock time of the current simulator: if the event state of the online task is in the generation state, the S5 task algorithm scheduling module is triggered to perform task scheduling; if the event state of the online task is in the removal state, the related machine node resource usage is updated.

The task scheduling algorithm module is used to perform:

S501: integrating different task scheduling algorithms into the scheduling algorithm library of the simulator using the plug-in in software design mode. The user can specify the scheduling algorithm used in this operation of the simulator through the configuration file xml.

The machine node resource information counting and collecting module is used to perform:

S601: dynamically calculating the number of CPU cores and memory capacity usage of each node at a certain time according to the number of tasks running on each node and the resource consumption of the tasks.

S602: if the user needs to analyze the resource utilization rate of the cluster at each moment in real time, the machine node resource information counting and collecting module can output the resource utilization status on the node to CSV file at a certain interval (such as 5 seconds) after receiving the user's instruction.

The simulator operation control module is used to perform:

S701: setting the start time point and end time point of the wal-clock that the simulator runs. These two time points correspond to two time points in the Alibaba Cloud log.

S702: setting the acceleration ratio of the simulator operation.

Optionally, the machine node event information module includes a node adding submodule and a node deleting submodule.

Optionally, the machine node event driving module includes a hash table.

The task scheduling subsystem first sets the task scheduling time period required by the simulator to simulate the cloud computing data center through the simulator operation control module, starts the simulator operation. Then the task operation information loading module loads task information that needs to be simulated from the output data of the data preprocessing subsystem, loads new machine node information in real time through the machine node event driving module, manages the running status of tasks through the batch task event driving module and online task event driving module, loads the specified scheduling algorithm through the task scheduling algorithm module and schedules the tasks in the wait state, and calculates the number of CPU cores and memory usage of each node in real time through the machine node resource information counting and collecting module, and outputs them to the specified output directory.

Example

Figure 2:
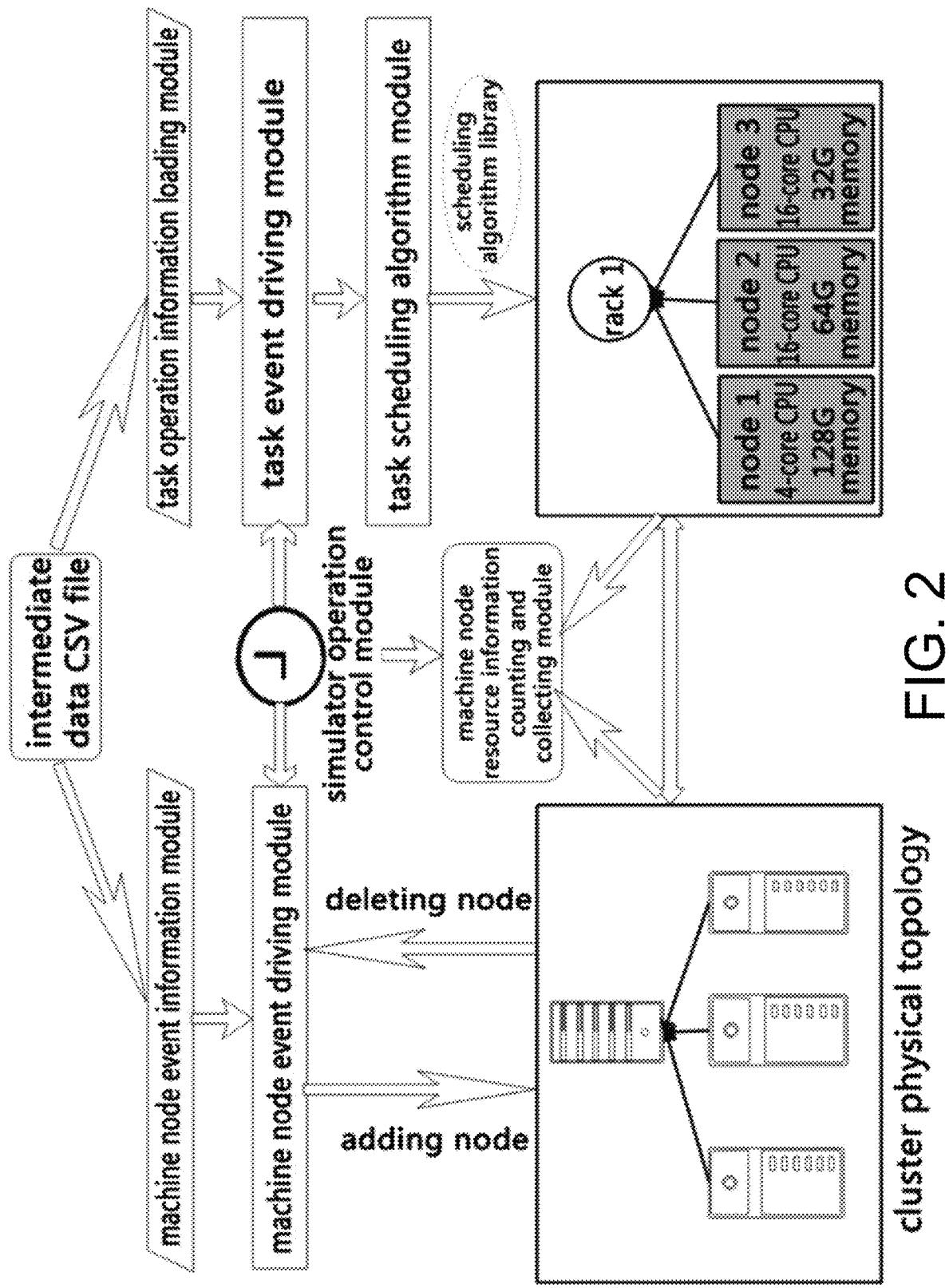
FIG. 2 is a work flowchart of a task scheduling subsystem of the task scheduling simulation system according to the present application.

This application relates to a task scheduling simulation system for a cluster environment, and it is explained in detail with Alibaba Cloud as the object:

Refer to FIGS. 1-2, the data preprocessing subsystem is shown first. As shown in FIG. 1, the input of the data preprocessing subsystem is the 24-hour running log published by Alibaba Cloud, and the output is the preprocessed CSV file as the input data of the subsequent simulator system. The preprocessing is divided into 4 modules. The data exception handling module reads 4 running logs of the native Alibaba Cloud cluster for exception handling. Exception handling operations mainly include removing task instance records and online task records whose end time is less than the start time. For the lack of information on the resource requirements of the batch task instances, the average value of the resource requirements of the unified task instances is used to fill. For example, if the CPU core numbers application record of a certain batch task instance is missing, an average value of the CPU core numbers application of all other task instances with the same task account is calculated, and the missing value is replaced with this average value.

The task information counting module is to count the task information of each submitted job, including counting the number of tasks owned by each task, and forming a map wherein the job ID and task ID set maps. The key is the job ID and the value is the ID set of the task.

The resource demand counting module first sums the required number of CPU cores and memory capacity of each task instance according to a single task, and then counts the total required number of CPU cores and demanded memory capacity of this task. Then, the required number of CPU cores and demanded memory capacity of each task instance according to a single task are summed, and the total required number of CPU cores and total demanded memory capacity of this job are calculated.

The running time counting module calculates the running time of each batch task or online task instance from the log records. Since the start time of the task instance may be earlier than the start time of Alibaba Cloud log sampling, and the end time of the task instance may be later than 24 hours, there are two situations. First, if the task instance starts to run earlier than midnight, modify the start time of the task instance to 0 seconds. Second, if the end time of the task instance is later than 24 hours, modify the end time of the task instance to an int integer Maximum value. Finally, the running time of each task instance is calculated as the end time of the task instance minus the start time, in seconds.

Finally, the new log records generated by the task information counting module, resource demand counting module, and running time counting modules are output to the intermediate data CSV file. The above three modules can starts 3 threads for parallel processing at the same time.

2. Task Scheduling Subsystem

The specific workflow of the task scheduling subsystem is shown in FIG. 2. Firstly, the user inputs the time period during which the simulator needs to simulate the task running in the cloud platform, such as 0:00 to 12:59. This time period information is used for the initialization of the simulator operation control module. After initialization, the simulation clock starts to run. Secondly, the simulator operation control module starts the machine node event driving module and the task event driving module, and then reads the intermediate data CSV file output by the data preprocessing subsystem line by line according to the current simulation clock. If the read information belongs to the machine node event file, the information is sent to the machine node event driving module which is responsible for parsing. The machine node event information module may be divided into two types: node adding submodule and node deleting submodule. The machine node event driving module uses a hash table to record the machine node information in the current cluster. Therefore, when node adding and deleting event information needs to be processed, the machine node event driving module operates the hash table to add or delete cluster nodes, in order to simulate the current number of cluster machine nodes and resource conditions consistent with actual production environment logs. On the other hand, the task operation information loading module is responsible for loading data from the intermediate data CSV file into the memory map data structure. The simulator operation control module sends the task event information of the current clock from the map to the task event driving module for processing. The task event driving module analyzes these task event information, obtains the CPU and memory requirements of each task, generates a directed acyclic graph of the task, and submits it to the task scheduling algorithm module for resource allocation and task scheduling.

Before running the task scheduling algorithm, the simulator operation control module notifies the machine node resource information counting and collecting module to collect the resource utilization of each node, including the number of the remaining CPU cores and allocatable memory capacity, and finally to update the resource utilization topology of the entire cluster. The task algorithm scheduling module takes this resource utilization topology as input data, loads the user-specified scheduling algorithm code from the algorithm scheduling library, and runs the task scheduling program. At the same time, the simulator operation control module records the start time and end time of the operation of the scheduling program, calculates the running time of the scheduling program, and returns it to the user as the running efficiency of the scheduling algorithm. When the task scheduling program is executed, the matching information of the task and the node is obtained. Based on this information, the task event driving module updates the node task queuing table it maintains, that is, enqueue or dequeue tasks from the batch task and real-time task running queues of each node, so as to maintain the current number and status of running tasks in the cluster consistent with that of the actual production environment. On the other hand, the machine node resource information counting and collecting module rescans the task running queue in each node, and updates the number of CPU cores and the used and available amounts of the memory capacity of each node according to the resource requirements of each task. Finally, the resource utilization topology of the entire cluster is updated.

In the data center of Alibaba Cloud, machine nodes show heterogeneity in the number of CPU cores and memory capacity due to the replacement. For this reason, the log information published by the Alibaba Cloud Data Center not only records the number of CPU cores, memory capacity and disk capacity of the machine node, but also records the time stamp of the joining or downtime of each machine node. Therefore, the task scheduling of the cluster at a certain moment will be constrained by the number of CPU cores and memory capacity available on each machine node. Since SLS does not consider the hardware resources of actual machine nodes, it treats the CPU and memory resources of all machine nodes as same type, therefore, SLS cannot accurately and fully simulate the scheduling of Alibaba Cloud tasks. Based on the 24-hour cloud computing platform cluster task operation log published by Alibaba Cloud, this system realizes the process of simulating the task submission, scheduling, running and termination of Alibaba Cloud cluster nodes on a single machine node. Moreover, at a certain time within 24 hours, the system can simulate the utilization of CPU and memory resources on each machine node according to the number of tasks running on each machine node and its life cycle status.

Although the application has been described above with reference to specific embodiments, those skilled in the art should understand that many modifications can be made to the configuration and details disclosed in the application without departing the principles and scope disclosed in the application. The protection scope of this application is determined by the appended claims, and the claims are intended to cover all the modifications included in the literal meaning or scope of equivalents of the technical features in the claims.

What is claimed is:

1. A non-transitory task scheduling simulation system, the system includes a data preprocessing subsystem and a task scheduling subsystem;

the data preprocessing subsystem is used to filter the input cloud computing log information for abnormal data and extract running time of each task;

the task scheduling subsystem is used to enqueue or dequeue tasks from the batch task and real-time task running queues of each node, and keep the number and status of tasks currently running in a cluster consistent with an actual production environment, and update the number of CPU cores, and the used and available memory capacity of each node according to resource requirement of each task, to obtain the latest topology of the overall cluster resource utilization;

wherein the data preprocessing subsystem comprises a data exception and missing processing module, a task information counting module, a resource demand counting module, and a running time counting module;

the data exception and missing processing module is used to read a native cloud computing cluster operation log to exclude abnormal data;

the task information counting module is used to count the task information and the number of task instances of each submitted job;

the resource demand counting module is used to count the total required number of CPU cores and the total required capacity of memory for each job;

the running time counting module is used to calculate the running time of each task instance, and to counting the estimated running time of each job.

2. The non-transitory task scheduling simulation system of claim 1, wherein the task information counting module, the resource demand counting module, and the running time counting module simultaneously start 3 threads for parallel processing.

3. The non-transitory task scheduling simulation system of claim 1, wherein the task scheduling subsystem comprises a task operation information processing unit, a control unit, and a machine node event processing unit;

the task operation information processing unit comprises a task operation information loading module, a task event driving module and a task scheduling algorithm module;

the control unit comprises a simulator operation control module, and a machine node resource information counting and collecting module;

the machine node event processing unit comprises a machine node event information module and a machine node event driving module.

4. The non-transitory task scheduling simulation system of claim 3, wherein the task event driving module comprises a batch task event driving submodule and an online task event driving submodule.

5. The non-transitory task scheduling simulation system of claim 3, wherein the machine node event information module comprises a node adding submodule and a node deleting submodule.

6. The non-transitory task scheduling simulation system of claim 3, wherein the machine node event driving module comprises a hash table.

* * * * *